United States Patent
Beck (10) Patent No.: US 6,771,698 B1
(45) Date of Patent: *Aug. 3, 2004

(54) SYSTEM AND METHOD FOR TESTING ANTENNA GAIN

(75) Inventor: Brian C. Beck, Melbourne, FL (US)

(73) Assignee: Harris Corporation, Melbourne, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 09/290,467

(22) Filed: Apr. 12, 1999

(51) Int. Cl.[7] ............................................... H04B 17/00
(52) U.S. Cl. ...................... 375/224; 375/130; 375/267; 455/67.1; 455/67.2; 455/67.5
(58) Field of Search ................................. 335/130, 224, 335/267; 342/360, 172; 343/703; 455/67.5, 67.1, 67.2, 67.3, 67.4; 375/142; 370/282

(56) References Cited

U.S. PATENT DOCUMENTS

| | | | | |
|---|---|---|---|---|
| 2,987,586 A | | 6/1961 | Berger ........................ 370/241 |
| 3,605,018 A | | 9/1971 | Coviello ..................... 375/349 |
| 3,694,643 A | | 9/1972 | Smith ........................ 702/110 |
| 3,875,500 A | | 4/1975 | Fletcher et al. ............. 324/624 |
| 4,028,622 A | | 6/1977 | Evans et al. ................ 324/624 |
| 4,275,446 A | | 6/1981 | Blaess ........................ 702/71 |
| 4,648,124 A | | 3/1987 | Mantovani et al. ......... 455/67.3 |
| 4,754,496 A | * | 6/1988 | Fishkin et al. .............. 455/67.5 |
| 4,903,038 A | * | 2/1990 | Massey ...................... 343/786 |
| 5,048,015 A | | 9/1991 | Zilberfarb ................... 370/312 |
| 5,103,459 A | | 4/1992 | Gilhousen et al. .......... 370/206 |
| 5,347,537 A | * | 9/1994 | Mori et al. .................. 375/142 |
| 5,371,760 A | | 12/1994 | Allen et al. ................. 375/142 |
| 5,461,921 A | | 10/1995 | Papadakis et al. ............ 73/628 |
| 5,649,304 A | | 7/1997 | Cabot ........................ 455/67.4 |
| 6,005,891 A | * | 12/1999 | Chadwick et al. .......... 375/224 |
| 6,061,388 A | * | 5/2000 | Saulnier et al. ............. 375/130 |
| 6,144,692 A | * | 11/2000 | Beck .......................... 375/130 |

OTHER PUBLICATIONS

D. Burkhart, "*Intermodulation and Crossmodulation Measured Automatically from 25 to 1000 Megahertz,*" News from Rohde & Schwartz, vol. 16, No. 74, pp. 7–10, 1976.

* cited by examiner

Primary Examiner—Shuwang Liu
(74) Attorney, Agent, or Firm—Allen, Dyer, Doppelt, Milbrath & Gilchrist, P.A.

(57) ABSTRACT

A system and method for testing an antenna, such as for antenna gain, is disclosed. The system generates an antenna test signal at a selected frequency. A pulse phase modulator modulates the signal with a random pseudo-noise sequence to produce a broad band spread spectrum antenna test signal. A transmission antenna is connected to the pulse phase modulator for transmitting the broad band spread spectrum antenna test signal to a test antenna. A pseudo-noise generator generates the respective pseudo-noise sequence at a predetermined delayed time corresponding to the time delay of a spread spectrum signal from the transmission antenna through the test receiver. A mixer mixes the broad band spread spectrum antenna test signal with the generated pseudo-noise sequence for despreading the broad band spread spectrum antenna test signal. Any signals generated by any reflections or interference that is not synchronized with the original spread spectrum signals is decorrelated. The gain of the test antenna is then determined. The purpose of the invention is to avoid the need for expensive anechoic chambers.

32 Claims, 7 Drawing Sheets

SYSTEM AND METHOD FOR TESTING ANTENNA GAIN

FIELD OF THE INVENTION

This invention relates to testing antennas, and more particularly, this invention relates to testing antenna gain.

BACKGROUND OF THE INVENTION

Antennas are used for a wide variety of communications, radar and other applications, both in a transmit and in a receive mode. Antennas may take many shapes and forms, from simple whips to complex reflector schemes, to phased arrays, and may be used on the earth's surface, in the air or in space. No matter what type of application, antennas are principally characterized by a broad set of gain or gain-related parameters. These include primary gain (in the intended direction, and relative to some reference standard such as isotropic), gain patterns over all angles from the intended direction, and frequency response (gain as a function of frequency). A typical requirement is to achieve as much gain as is possible in the intended direction, while minimizing gain in all other directions. Peaks of gain in unintended directions, called side lobes, usually must be minimized by design. For some applications, a desired specific frequency response must be attained, often seeking as wide a bandwidth as possible. For these reasons, antenna testing must be conducted during antenna development, adjustment or maintenance to measure gain and frequency response (including phase and amplitude response).

The amount of antenna gain is important due to the fact that antenna gain tests can be effected by extraneous reflections off walls and by other signals. Antenna gain testing and any related pattern testing typically occurs in an anechoic chamber, where many parameters can be measured, such as the antenna gain and the frequency/phase response. Typically, the anechoic chamber is a building that is designed and manufactured to have few echoes, such as those produced by signal reflections from natural and man-made objects. The chamber surface is covered with electromagnetically absorbing cones, which absorb any reflective signals. The anechoic chamber is also designed so that the area is free of extraneous signals, such as citizen band radio signals and other interfering or jamming signals. Naturally, these anechoic chambers are very expensive.

One conventional approach used for testing for antenna gain and pattern is to place an antenna-under-test in the anechoic chamber, together with a test antenna, and transmit a radio frequency or microwave signal from one antenna to the other antenna (in either direction). After the signal is received within the antenna, a receiver measures antenna gain through appropriate means known to those skilled in the art, such as possibly using a spectrum analyzer. In some instances, the frequency versus phase response is determined. However, reflections off the wall of the test signal sometimes cause extraneous results. Thus, unless alternatives are found for the very stringent design requirements necessary for operating anechoic chambers for testing antenna gain and pattern, it is mandatory that large expenditures of personnel time, money and other resources be placed into the design, testing, manufacture and operation of these sophisticated anechoic chambers.

SUMMARY OF THE INVENTION

It is, therefore, an object of the present invention to provide a system and method of testing for antenna gain and pattern either without using an anechoic chamber at all or using one having less stringent design requirements.

It is still another object of the present invention to provide a system and method of testing for antenna gain that is not prone to deviant measurements due to extraneous signals in the nearby environment.

In most measurement cases due to reciprocity, it is possible and practical to either transmit the test signals from a calibrated test transmit antenna to the antenna under test, used in a receive mode, or to transmit test signals from the antenna under test to a calibrated test antenna used in a receive mode. All subsequent explanations of this invention claim that either approach may be used as an implementation of this invention.

In the prior art, measurements were generally made using simple test signals, either sine waves of essentially zero bandwidth, or more rarely, truly random noise signals. The technique of this invention is to generate a spread spectrum (SS) pseudo-noise (PN) test signal wherein a test receiver can take advantage of the determinism of the PN signal to recover useful information about the antenna under test, but while rejecting undesired signals such as reflections or interference.

To measure antenna gain or angular patterns at a single frequency F1, a PN modulated signal is generated with a center frequency of F1, and with a bandwidth substantially within the bandwidth of the antenna under test. The characteristics of this PN modulation are such that the received signal may be collapsed in bandwidth to essentially zero bandwidth at F1, or at a down-converted frequency corresponding to F1, by carefully setting the locally-generated SS replica at a delay time τ corresponding to the delay from transmit to receive, including all path delays. The energy present at F1, or at a down-converted frequency corresponding to F1, is measured typically by a receiver signal strength indication or by spectrum analyzer, and is converted by calculation to an estimate of antenna gain, with all the other usual test factors considered. In doing so, reflections and interfering signals are substantially rejected because they are not correlated with the test signal.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous over prior art systems and methods for testing antenna gain and other patterns because the necessity of having an anechoic chamber with stringent design requirements is no longer necessary. In the present invention, the antenna gain of a test antenna can now be tested without concern for any reflective signals, such as from walls, fences or trees, or extraneous signals, such as emanating from citizen band radios, and any intermodulation.

An antenna test signal is generated and modulated to produce a broad band spread spectrum antenna test signal, which is transmitted through an antenna to the test antenna after which it is demodulated. Appropriate circuitry despreads or "collapses" the broad band spread spectrum test signal. Any signals that are generated by reflections or interference that is not synchronized with the original spread spectrum signals (or delayed by path loss) is decorrelated. When the desired information is despread or "collapsed," any other spurious signals would be subject to the pseudo-noise sequence and have widened energy. This widening of spectrum dilutes the amount of unwanted energy which falls into the receiver's baseband filter. The gain of the test antenna can then be measured from the despread signal.

Figure 1:
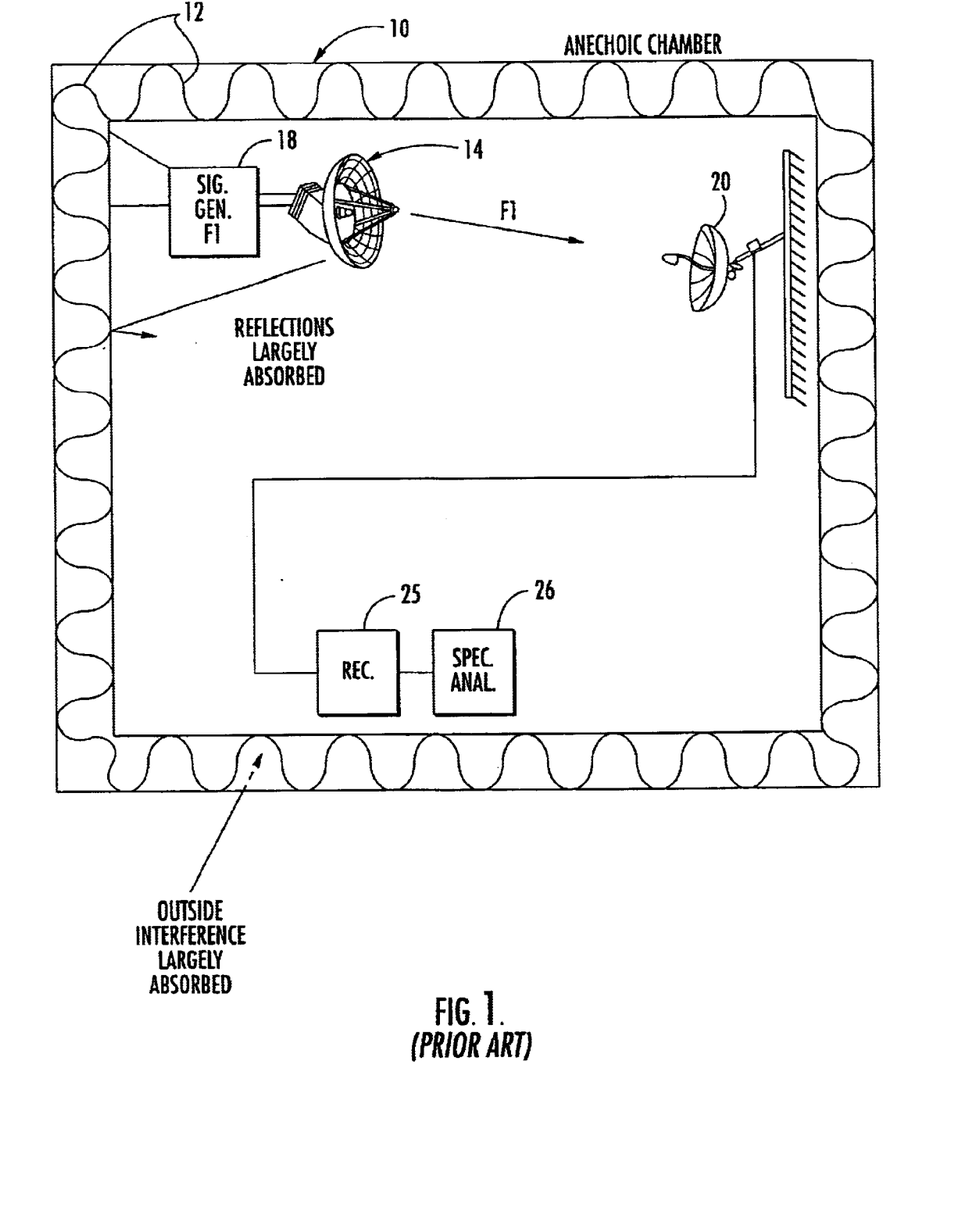
FIG. 1 is a schematic view of a prior art anechoic chamber having an antenna-under-test and test antenna where antenna gain is measured using a receiver and spectrum analyzer.

Referring now to FIG. 1, a prior art anechoic chamber 10 used for testing antenna gain is illustrated. Typically, the anechoic chamber is a large, expensive chamber. Therefore, the chamber includes an inside surface that generates few or no echoes and has a surface that is covered with electro-magnetically absorbing cones, illustrated schematically at 12. These cones 12 absorb also any extraneous signals, such as citizen band radio signals and other interfering or jamming signals.

As shown in FIG. 1 prior art, an antenna 14 is mounted in the anechoic chamber 10 by a mounting system that produces few echoes. The antenna includes a respective signal generator 18 that generates respective frequency F1. The signal generator 18 and antenna 14 include the standard circuitry associated with such testing systems. The generated frequency F1then is transmitted through the free space of the anechoic chamber to the antenna-under-test.

The anechoic chamber is also protective against any extraneous signals such as citizen bands.

As shown in FIG. 1 prior art, the antenna-under-test 20 receives the signals in a receiver 25, which includes appropriate circuitry and processors for determining antenna gain. The spectrum analyzer 26 can process the signals and give a spectrogram of the results.

FIGS. 2–9 illustrate a system and method of testing for antenna gain and pattern. A generated antenna test signal of preselected frequency is transmitted from an antenna and modulated with a pseudo-random noise sequence to produce the respective broad band spread spectrum antenna test signal. The antennae are in reciprocity and the transmitted signal could be from an antenna-under-test or calibrated test antenna. A demodulator receives the broad band spread spectrum signals, and a respective generator generates the same pseudo-random noise sequence as used in forming the original broad band spread spectrum signal at the transmit side. The generated pseudo-random noise sequence, however, is time delayed to account for the delayed time between transmission and receipt.

A demodulator receives the pseudo-random noise sequence spread spectrum signals, and despreads or "collapses" the signal to obtain the antenna test signal to determine antenna gain without interference from extraneous and reflected signals. Although FIGS. 2–9 describe a system and method of testing antenna gain using a pulse phase modulator, it should be understood that frequency hopping and other systems and methods for forming a broad band spread spectrum signal can also be used as known to those skilled in the art.

The present invention as described below will use direct sequence modulation, which phase-modulates a sine wave by a continuous string of pseudo-noise code bits. The distinction between bits and chips is only of interest in using spread spectrum for communicating a bit stream and not for antenna measurement. As is well known to those skilled in the art, this string is typically based on a random sequence of pseudo-noise spectrum spreading code that repeats only after a predetermined pseudo-noise code period, which is practically made long enough not to be spectrally significant. This pseudo-noise code-modulated signal can be characterized by the equation below:

$$s(t) = \sqrt{2P}\, PN(t) \cos(\overline{\omega}_0 t + \theta)$$

where P is the transmitted signal power; PN(t) represents the spectrum spreading code; $\overline{\omega}_0$ is the carrier radian frequency; and θ is the carrier phase. The pseudo-noise code is multiplied by the carrier, $\cos(\overline{\omega}_0 t + \theta)$. This modulation method is known as bi-phase shift keying (BPSK). The distinction between bits and chips is only of interest in using spread spectrum for communicating a bit stream not for antenna measurement. The pseudo-noise code phase-modulates the carrier by 0° or 180° according to whether PN(t) is +1 or −1. An alternate embodiment of this invention would be to use quadra-phase shift keying (QPSK) or even higher orders of phase shift keying. The principles are otherwise the same, however.

The receiver aligns the pseudo-noise code generator timing with the received pseudo-noise code timing. This is accomplished first by acquisition, where time shifts of the locally generated code are correlated with the received signal plus receiver noise. When code alignment is close, the correlated output becomes large. Second, a tracking circuit is engaged. The received signal is then despread.

As is well known to those skilled in the art, the tracking circuit (a code tracking loop) maintains the local receiver code aligned with the received code. The received code can be multiplied by the locally generated pseudo-noise code, which then removes the code on the received signal because $[PN(t)]^2 = 1$.

At this time, a biphase-modulated signal must be demodulated using a carrier tracking loop, such as a Costas loop or a squaring loop, tracking the carrier $\cos(\overline{\omega}_0 t+\theta)$. This allows phase-coherent recovery of the received carrier.

The reconstructed pseudo-noise code is never perfectly aligned with the received code, and the locally generated carrier likewise is not exactly in phase with the received carrier. Degradations therefore occur to the system as compared to an idealized system.

If an unmodulated tone at the carrier frequency is present at the receiver along with the spread signal, such as the afore-mentioned reflections or interference, then in a pseudonoise code despreading process, the undesired tone is spread or multiplied by the local pseudonoise code. This spreads the spectrum of a narrow band interference to a bandwidth $2/T_c$. Reflections of the already spread test signals being later in arrival at the receiver and therefore not correlated are further spread to a bandwidth of $4/T_c$ due to the correlation of the two spectra. However, the received signal is collapsed to an arbitrarily small tracking bandwidth of $f_T$ so that the energy detector only "sees" a small fraction, $2 \cdot f_T \cdot T_C$, of the original tone energy. The processing gain, approximately the ratio 1 divided by $2 \cdot f_T \cdot T_C$ ($>>1$), is used to determine the efficiency of a spread spectrum system in rejecting unwanted interference. Since there is no data recovery bandwidth required in this test system as compared to spread spectrum data communication systems, the bandwidth of the detector may be made arbitrarily narrow to recover the carrier energy. With practical tracking filters of about 10 HZ and 10 MHZ wide spread test signals, processing gains of around 60 dB are practical. By phase-locking the transmit and receive carriers and L.O.'s, even narrower receive filters are possible.

Low probability of intercept is achieved because the spread signal is wideband and has low spectral height. It cannot be easily detected in a noise background. Message privacy is assured if the actual pseudo-noise code sequence used by the transmitter and receiver is unknown to unwanted listeners. Multipath tolerance is achieved by searching first with minimum delay and then expanding the search to larger delays. The desired signal will have less delay than the multipath signal and will be acquired first. In this way, reflections which might otherwise degrade antenna measurement are rejected.

Figure 2:
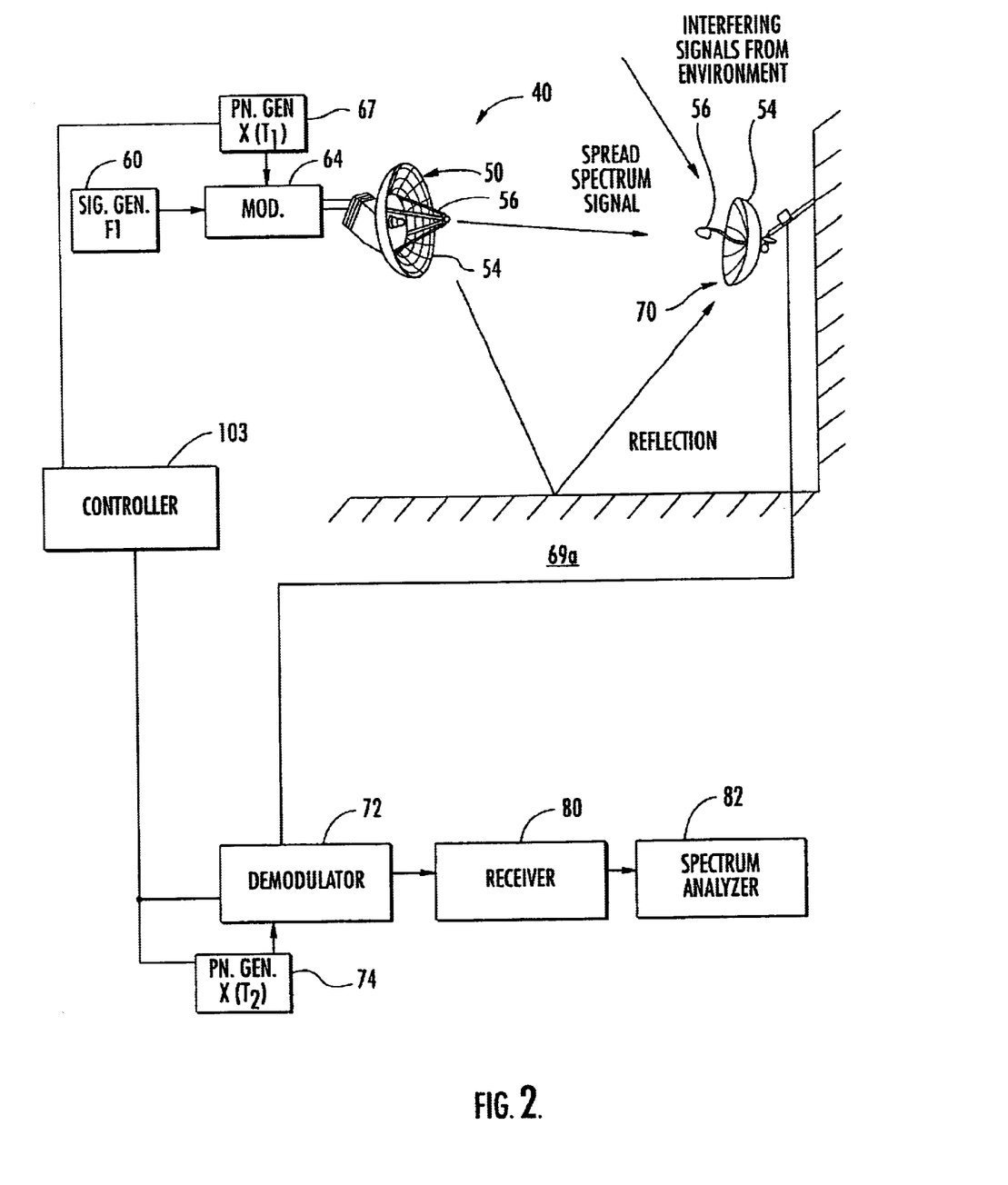
FIG. 2 is a schematic environmental view of a system of the present invention showing a generated spread spectrum antenna test signal, which is received in an antenna or antenna-under-test, demodulated and analyzed to determine antenna gain.

Referring now to FIG. 2, there is illustrated a system 40 of testing for antenna gain pattern and frequency response in a system that generates a test antenna signal from transmission antenna 50 to test antenna 70. Both antennas 50, 70 are illustrated as dish antennas, each having a parabolic reflector 54 and a horn 56. However, the present invention can be used for testing any type of antenna, as well as many other types of wave guides and other communication devices.

As illustrated, the system 40 broadly includes a signal generator 60 which produces respective antenna test signal at frequency F1. The signal is then transmitted to respective modulator 64, where a first pseudo-noise component $X(\tau_1)$ is mixed within the modulator 64 for modifying F1 to produce a broad band spread spectrum signal. The pseudo-noise sequence is produced by respective PN generator 67. The modulator 64 can be a biphase or quadriphase shift key modulator and $X(\tau_1)$ is preferably a pseudo-noise random sequence. The generated broad band spread spectrum signal then is transmitted from the respective transmission antenna 50 into free space to the test antenna 70.

The broad band spread spectrum signal is received by the antenna-under-test, which affects the signal with the antenna gain and frequency response to be measured. The signal is then despread, i.e., "collapsed" by demodulating in demodulator 72 with pseudo-noise random sequences $X(\tau_2)$. This sequence corresponds to the same sequence used in modulating the original antenna test signal, except the sequence is delayed to account for the radio frequency path loss between the transmission and receipt. The random sequence is produced by PN generator 74.

The demodulated, i.e., despread, broad band spread spectrum antenna test signal is then received into a receiver 80, where associated electronic circuitry determines the antenna gain as known to those skilled in the art. As illustrated, a spectrum analyzer 82 can obtain the desired signal information relating to the test antenna 70 and display a spectrogram of the signal information. It is evident that any reflections produced, such as from the wall 69a, arrive at the receiver 80 later and are decorrelated. Other signals that may not have been part of the broad band spread spectrum transmission, once subject to the pseudo-random noise sequence in the demodulator 72, will become spread and have a broad band energy level and thus be decorrelated. The desired demodulated signal will have a narrow spike in frequency, and no longer the broad band envelope, corresponding to the original spread spectrum energy level. By appropriate calibration of the entire system, those skilled in the art of antenna and RK testing can use the output energy data to calculate the estimate of antenna gain (and frequency response).

Figure 3A:
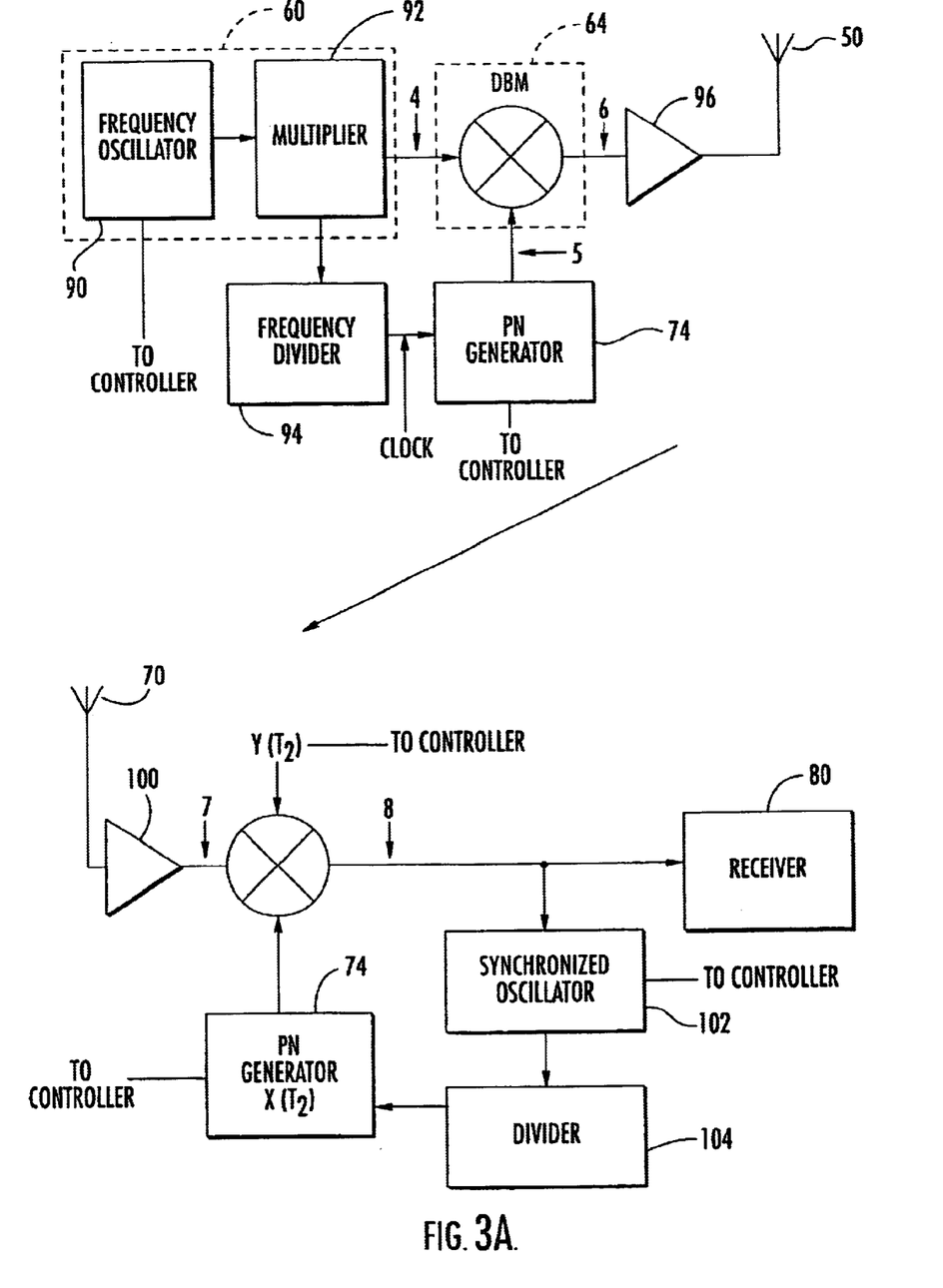
FIG. 3A is a block diagram showing basic components of the system of FIG. 2.
Figure 3B:
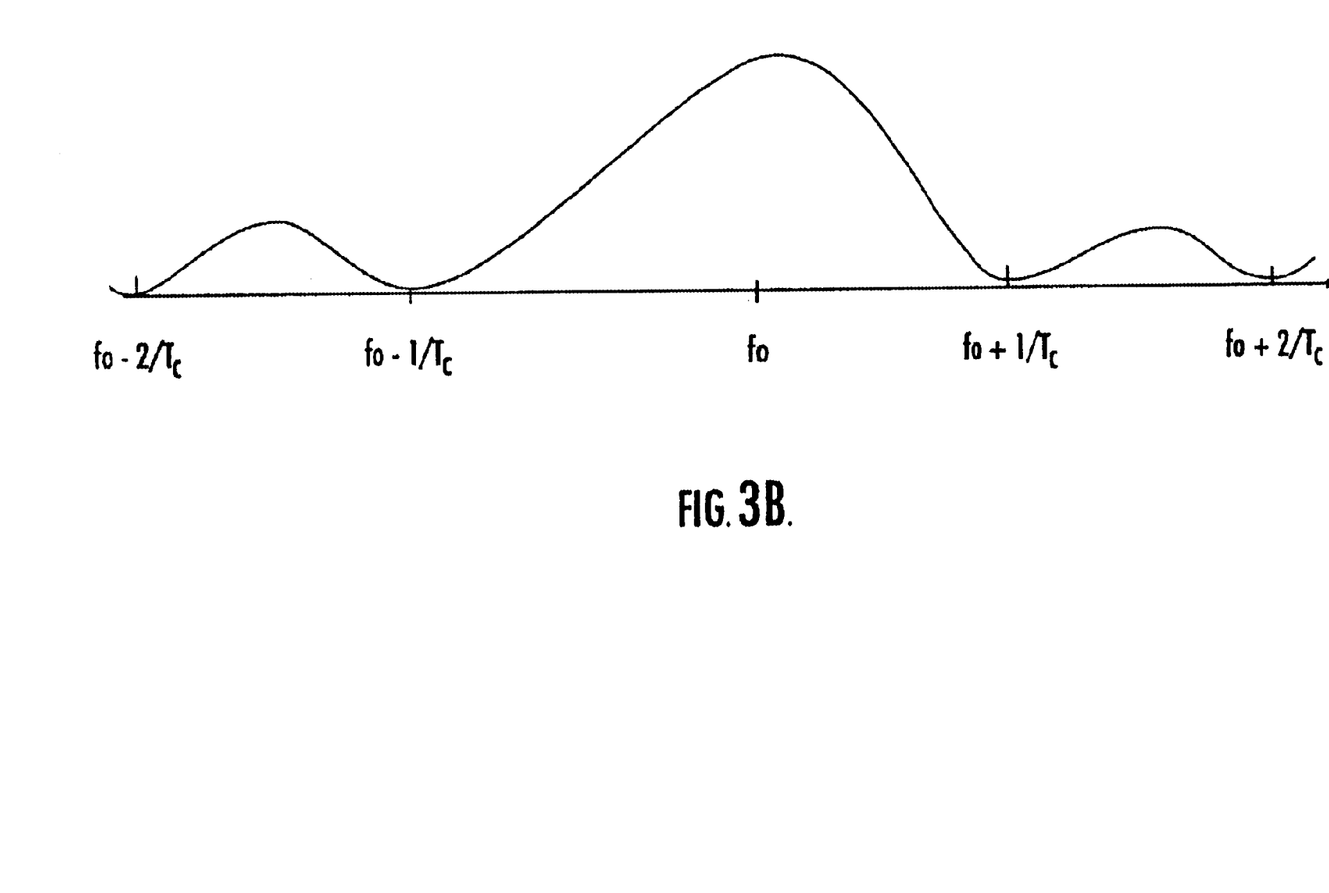
FIG. 3B is a graph depicting modulated data and spread spectrum signals, respectively.

Referring now to FIG. 3A, there is illustrated a block circuit diagram showing greater details of the various components that could be used in the system 40 of the present invention.

As shown in FIG. 3A, the signal generator 60 includes a frequency oscillator circuit 90 that generates the desired frequency corresponding to F1. The generated frequency then is multiplied in a multiplier circuit 92. A part of the signal is transmitted to a frequency divider circuit 94 where the frequency is divided by as little as half to as many as several thousand or more of the original signal as known to those skilled in the art. The divided signal is forwarded to the PN generator 67, which generates a pseudo-random noise sequence, such as shown in the representation of the spectrogram of FIG. 5, where amplitude is shown on the vertical axis and time on the horizontal axis. This sequence is a random pulse train having a constant amplitude, which will work to "spread" the frequency component of the generated signal.

Figure 4:
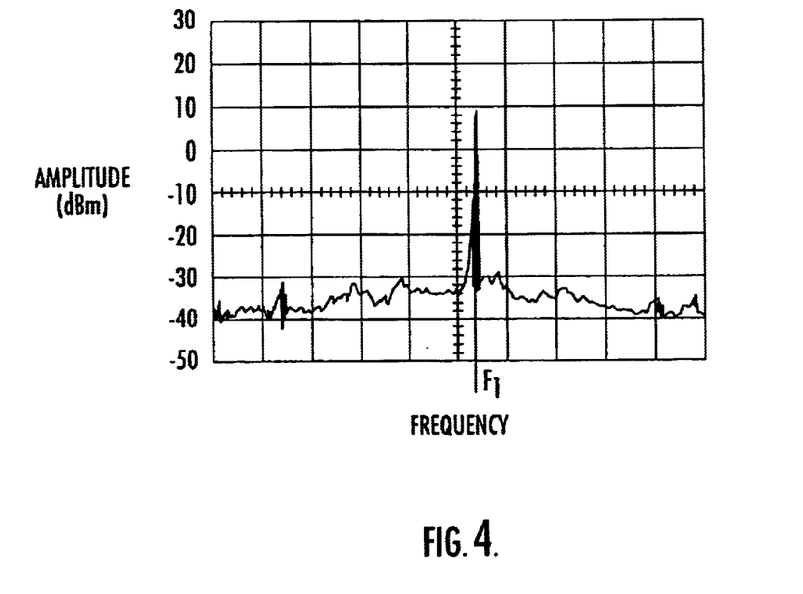
FIG. 4 is a spectrogram showing a generated frequency as at line 4 in FIG. 3A before modulation with a pseudo-noise sequence.
Figure 5:
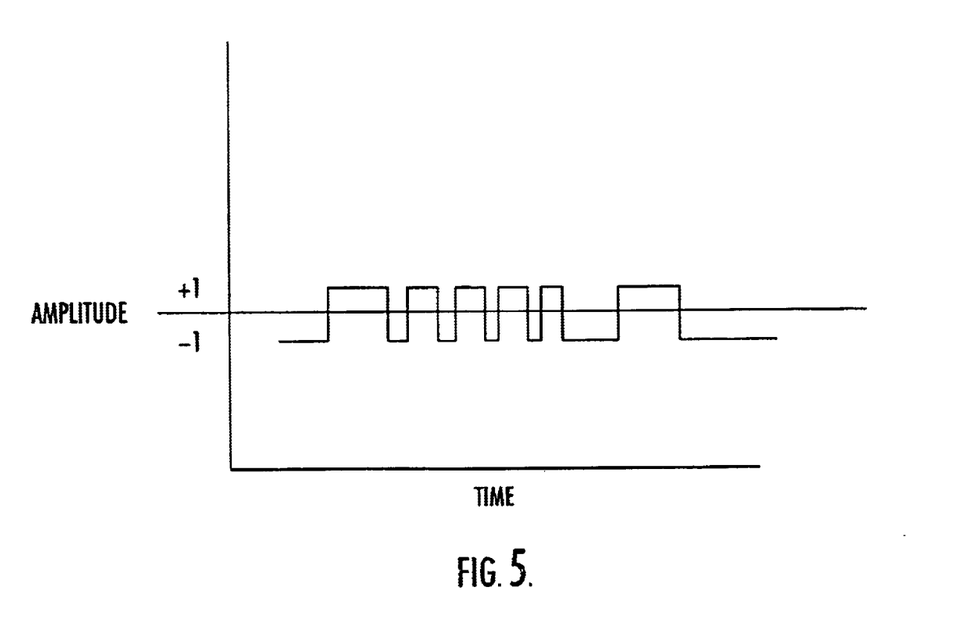
FIG. 5 is a graph showing the generated pseudo-noise sequence as a function of time and amplitude, such as taken at line 5 in FIG. 3A.

The generated frequency exits the multiplier circuit 92 having a frequency component, as illustrated in the spectrogram of FIG. 4, and taken at line 4, showing a frequency spike corresponding to the original carrier and modulation components that accompany it.

Figure 6:
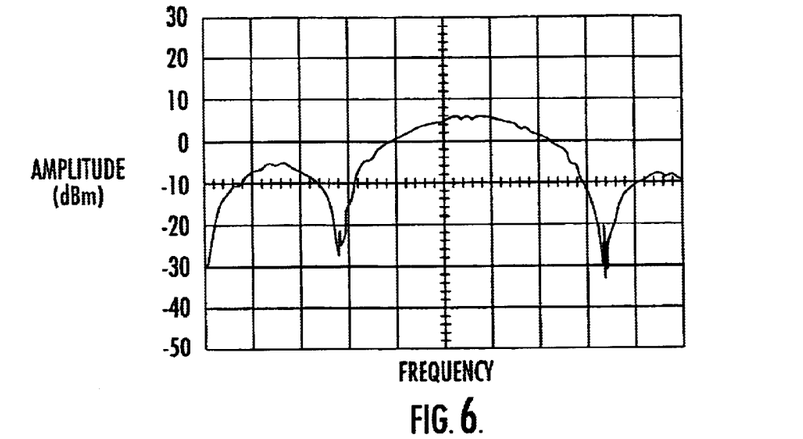
FIG. 6 is a spectrogram showing the envelope of an unfiltered biphase, modulated spread spectrum signal, such as taken at line 6 in FIG. 3A.

This signal is forwarded to the modulator 64, which in the present invention can comprise a doubly balanced mixer (DBM) where the frequency is mixed with the generated pseudo-noise sequence to form a broad band spread spectrum signal as shown in the spectrogram of FIG. 6. The modulator 64 is a mixer as is well known to those skilled in the art, and the PN generator and mixer can work as a biphase or quadriphase modulator, depending on the chosen design by one skilled in the art.

As illustrated by the spectrogram of FIG. 6, the envelope of an unfiltered biphase-modulated, broad band spread spectrum signal is viewed on a spectrum analyzer. As shown, the envelope includes lobes and has a broad band spread energy. This broad band spread spectrum signal then is transmitted through an amplifier 96 that may include appropriate filters (perhaps to remove the frequency side lobes) as known to those skilled in the art, and then transmitted through the transmission antenna 50 to the receive end of the system and to test antenna 70. The signal is amplified and filtered in an amplifier and filtering circuit 100.

Figure 7:
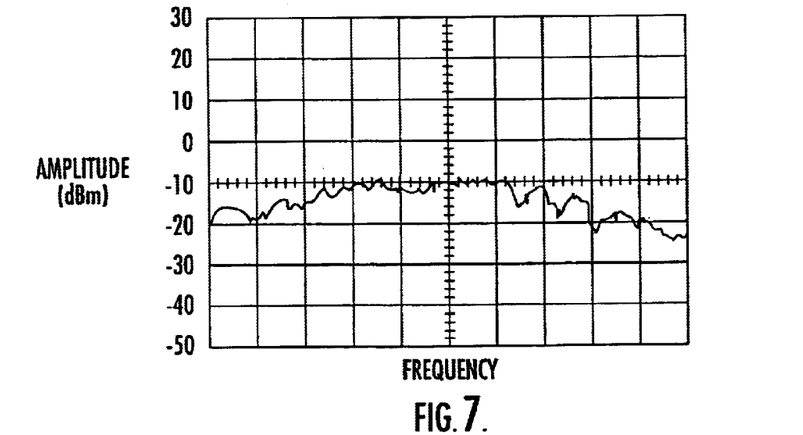
FIG. 7 is a spectrogram showing the received spread spectrum signal, such as taken at line 7 on FIG. 3A, and showing a small hump in the noise floor.

The spectrogram of FIG. 7, taken at line 7, shows a filtered broad spread spectrum signal as received, and shows only a 5–10 decibel "hump" in the noise floor. This signal may differ from the transmitted spectrum shown in FIG. 6 in one or more. An oscillator 102 is synchronized with the transmit-end PN generator and the transmitted spread spectrum signals, such as through an appropriate controller 103 (FIGS. 2 and 3), which also connects to PN generators. The oscillator 102 generates signals that are divided in divider 104 and forwarded to a PN generator 74, which generates a pseudo-noise sequence $X(\tau_2)$ that is the same sequence used in the transmit side, but delayed to account for radio frequency path loss and time delay (equal to $\tau 2 - \tau 1$. This sequence is forwarded to the demodulator 72, which can be a doubly balanced mixer as known to those skilled in the art.

Figure 8:
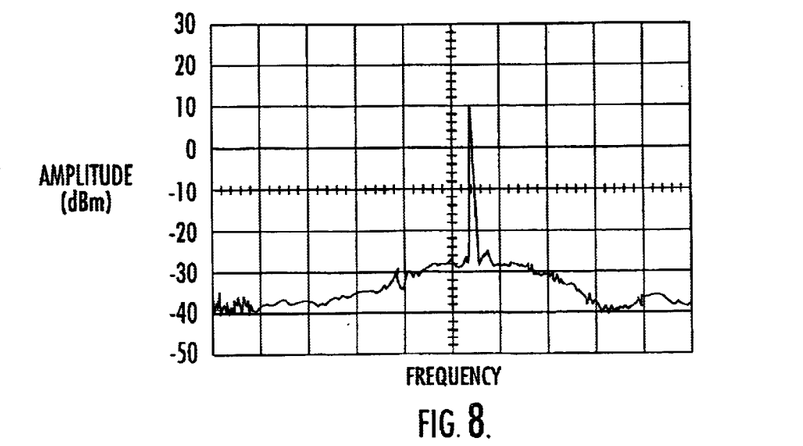
FIG. 8 is spectrogram showing the despread signal at the output of a receiver mixer, such as taken at point 8 of FIG. 3A.

The signal is forwarded to the receiver 80 and by appropriate circuitry processes the despread signals to determine antenna gain, together with the spectrum analyzer 82. A spectrogram is produced as shown in FIG. 8, showing the antenna gain.

Figure 9:
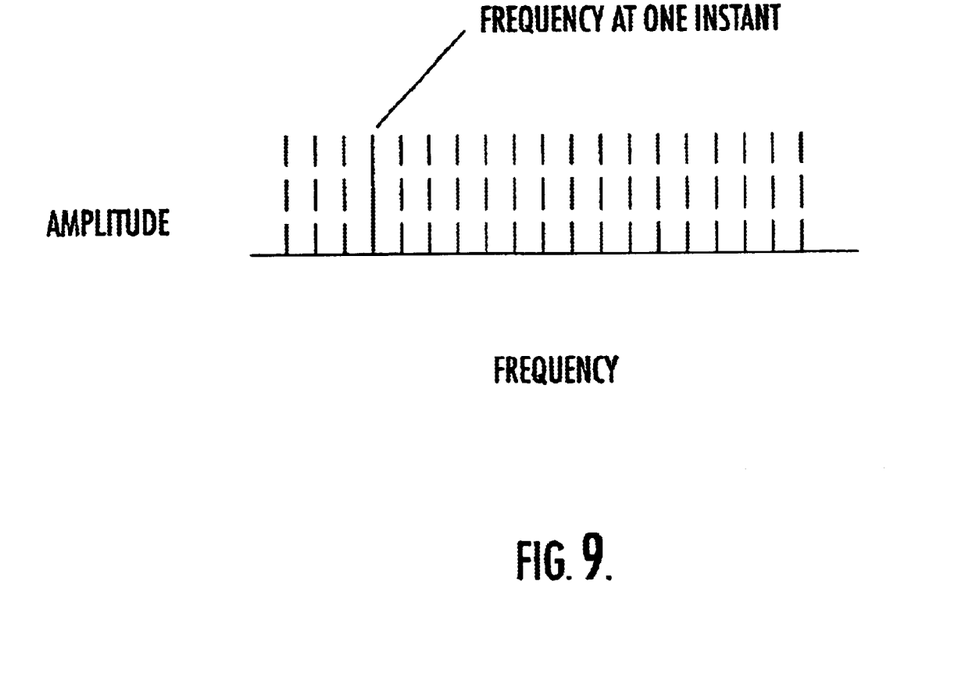
FIG. 9 is a spectrogram of power versus frequency of frequency-hopping spread spectrum signals.

It should be understood that frequency hopping can also be used for forming the broad band spread spectrum signal, as shown in FIG. 9, where power versus frequency for a frequency-hopping spread spectrum signal is illustrated. The emissions move or "jump" around to discreet separate frequencies in a pseudo-random fashion, thus, creating a broad band spread spectrum signal. Other possible types of spread spectrum signal generation includes the use of direct-sequence and frequency-time dodging. The direct-sequence wave forms are typically pseudo-random digital streams generated by digital techniques and without using any type of spectral filtering. It is only when heavy filtering is used that the signal becomes noise like, thus forming a PN wave form. In both systems, correlation detection would be used because the wave form would be dimensionally too large to implement a practical matched filter, and the sequence generator is relatively simple and capable of changing codes for the invention.

In a frequency hopping system, the spectrum is divided into subchannels that are spaced orthogonally at 1/T separations. One or more separations can be selected by pseudo-random techniques for each data bit. In a time-dodging scheme, the signal burst time would be controlled by a pulsed repetition method, while in a frequency-timed dodging system, both types of selections would be used. A frequency-hop signal can be generated using SAW chirp devices. Synchronization is always a problem in any type of spread spectrum system and the receiver typically must store a reference timing to within plus or minus 1/(2W) of the width of the receive signal and hold it at that value. There are also various methods to reduce the synchronization acquisition time. These methods include using timing references to start PN generators, using shorter sequences for acquisition only, "clear" synchronization triggers, and paralleling detectors. Such techniques are known to those skilled in the art of similar systems such as are used for data communications.

It is evident that any reflections from the wall 69a or a tree arrives late at the receiver and is decorrelated. Other signals such as extraneous radio or microwave signals that are not initially subjected to the PN sequence at the modulator and spread would be spread at the demodulator.

The system and method of the present invention is advantageous over the prior art system and method for testing for antenna gain and pattern because the strict design requirements of an anechoic chamber are no longer required. In many instances, no anechoic chamber is required at all. Even if many different reflective broad band spread spectrum signals were mixed with spurious signals, such as microwaves and radio frequencies generated from outside the testing area, the signals would either be despread out of time with the original radio frequency, or would be spread by the pseudo-noise sequence generated at the receive end of the system. Therefore, the system and method of the present invention saves money by reducing design costs and makes operation much more efficient. Modern digital hardware implementations of spread spectrum modulations and receivers are relatively inexpensive.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A system for testing an antenna comprising:

a signal generator for generating an antenna test signal at a selected frequency;

a spread spectrum modulator for modulating the antenna test signal to produce a broad band spread spectrum antenna test signal;

a calibrated test antenna connected to the spread spectrum modulator for transmitting in reciprocity the broad band spread spectrum antenna test signal;

an antenna-under-test for receiving in reciprocity the broad band spread spectrum antenna test signal from the calibrated test antenna;

a receiver connected to the antenna-under-test for receiving the broad band spread spectrum antenna test signal and further comprising:

a demodulator for demodulating the broad band spread spectrum antenna test signal;

a decorrelator for decorrelating any signals generated by any reflections or interference that are not synchronized with the antenna test signal; and means for measuring the gain of the antenna-under-test from the antenna test signal.

2. A system according to claim 1, wherein said spread spectrum modulator comprises a pulse phase modulator having a shift keyed modulator for generating a pseudo-random noise sequence.

3. A system according to claim 2, wherein said pulse phase modulator comprises a mixer.

4. A system according to claim 3, wherein said mixer comprises a doubly balanced mixer.

5. A system according to claim 3, wherein said signal generator generates the pseudo-random noise sequence such that the spread energy is substantially within the bandwidth of the calibrated test antenna.

6. A system according to claim 1, wherein said signal generator comprises a circuit for generating a frequency-hopped spread spectrum signal.

7. A system according to claim 1, wherein said signal generator comprises a circuit for generating a chirp signal.

8. A system according to claim 1, wherein said receiver further comprises a spectrum analyzer for analyzing the received signal.

9. A system for testing an antenna comprising:
a signal generator for generating an antenna test signal at a selected frequency;
a pulse phase modulator for modulating the antenna test signal with a pseudo-random noise sequence to produce a broad band spread spectrum antenna test signal;
a calibrated test antenna connected to the pulse phase modulator for transmitting in reciprocity the broad band spread spectrum antenna test signal;
an antenna-under-test for receiving in reciprocity the broad band spread spectrum antenna test signal from the calibrated test antenna;
a demodulation circuit connected to the antenna-under-test for receiving and demodulating the broad band spread spectrum antenna test signal and further comprising:
  a pseudo-random noise generator for generating the respective pseudo-random noise sequence at a predetermined delayed time corresponding to the time delay of the broad band spread spectrum antenna test signal;
  a mixer for mixing the broad band spread spectrum antenna test signal with the generated pseudo-random noise sequence for despreading the broad band spread spectrum antenna test signal; a decorreletor for decorrelating any signals generated by any reflections or interference that are not synchronized with the antenna test signal signal; and
means for measuring the gain of the antenna-under-test from the demodulated spread spectrum antenna test signal.

10. A system according to claim 9, wherein said antenna-under-test and calibrated test antenna each comprises a horn antenna.

11. A system according to claim 9, wherein said pulse phase modulator comprises a shift keyed modulator.

12. A system according to claim 9, wherein said pulse phase modulator comprises a mixer.

13. A system according to claim 12, wherein said mixer comprises a doubly balanced mixer.

14. A system according to claim 9, wherein said pulse phase modulator generates the pseudo-random noise sequence such that the spread energy is substantially within the bandwidth of the test antenna.

15. A system according to claim 9, wherein said pseudo-random noise generator for generating the respective pseudo-random noise sequences at a predetermined delayed time comprises an oscillator that is synchronized with the transmitted broad band spread spectrum antenna test signal and including a pseudo-random noise generator.

16. A system according to claim 9, wherein said receiver further comprises a spectrum analyzer for analyzing the received signal.

17. A method for testing antenna gain comprising:
generating an antenna test signal at a selected frequency;
modulating the signal to produce a broad band spread spectrum antenna test signal;
transmitting from a calibrated test antenna the broad band spread spectrum antenna test signal to an antenna-under-test;
demodulating the broad band spread spectrum antenna test signal;
decorrelating any signals generated by any reflections or interference that are not synchronized with the antenna test signal; and
measuring the gain of the antenna-under-test from the antenna test signal.

18. A method according to claim 17, and further comprising the step of modulating the antenna test signal with a pulse phase modulator having a shift keyed modulator.

19. A method according to claim 18, and further comprising the step of modulating within a mixer.

20. A method according to claim 19, wherein said mixer comprises a doubly balanced mixer.

21. A method according to claim 17, and further comprising the step of generating a broadband spread spectrum antenna test signal such that the spread energy is substantially within the bandwidth of the calibrated test antenna.

22. A method according to claim 17, and further comprising the step of generating a pseudo-random noise sequence at a predetermined delayed time in an oscillator that is synchronized with the transmitted broad band spread spectrum antenna test signal.

23. A method according to claim 17, and further comprising the step of analyzing the received signal within a spectrum analyzer.

24. A method according to claim 17, and further comprising the step of generating a frequency-hopped spread spectrum signal.

25. A method according to claim 17, and further comprising the step of generating a chirp spread spectrum signal.

26. A method for testing antenna gain comprising:
generating an antenna test signal at a selected frequency;
modulating the signal with a pseudo-random noise sequence to produce a broad band spread spectrum antenna test signal;
transmitting a calibrated test antenna the broad band spread spectrum antenna test signal to an antenna-under-test;
demodulating the broad band spread spectrum antenna test signal by generating the respective pseudo-random noise sequence at a predetermined delayed time corresponding to the time delay of the broad band spread spectrum signal from the calibrated test antenna;
mixing the broad band spread spectrum antenna test signal with the generated pseudo-noise sequence for despreading the broad band spread spectrum antenna test signals;
decorrelating any signals generated by any reflections or interference that is not synchronized with the original spread spectrum antenna test signal; and
measuring the gain of the antenna-under-test operating in the receive mode from the antenna test signal.

27. A method according to claim 26, and further comprising the step of modulating the antenna test signal with a shift keyed modulator.

28. A method according to claim 26, and further comprising the step of modulating within a mixer.

29. A method according to claim 28, wherein said mixer comprises a doubly balanced mixer.

30. A method according to claim 26, and further comprising the step of generating the pseudo-random noise sequence such that the spread energy is substantially within the bandwidth of the calibrated test antenna.

31. A method according to claim 30, and further comprising the step of generating the respective pseudo-random noise sequences at a predetermined delayed time in an oscillator that is synchronized with the transmitted broad band spread spectrum signals and including a pseudo-random noise generator.

32. A method according to claim 26, and further comprising the step of analyzing the received signal within a spectrum analyzer.

* * * * *

UNITED STATES PATENT AND TRADEMARK OFFICE
CERTIFICATE OF CORRECTION

PATENT NO. : 6,771,698 B1
DATED : August 3, 2004
INVENTOR(S) : Beck

It is certified that error appears in the above-identified patent and that said Letters Patent is hereby corrected as shown below:

Title page,
Item [75], delete "Melbourne" insert -- Melbourne Beach --

Column 3,
Line 62, delete "F1then" insert -- F1 then --

Column 4,
Line 43, delete "$\underline{\omega_0}$" insert --$\overline{\omega}_0$--

Column 7,
Lines 8-9, delete "FIG. 6 in one or more." insert -- FIG. 6. --
Line 16, delete "(equal to τ2 - τ1." insert -- (equal to τ2 - τ1.) --

Column 10,
Line 9, delete "broadband" insert -- broad band --

Signed and Sealed this

Twenty-eighth Day of December, 2004

JON W. DUDAS
*Director of the United States Patent and Trademark Office*